United States Patent [19]
Tang

[11] Patent Number: 5,661,479
[45] Date of Patent: Aug. 26, 1997

[54] OVERSAMPLING MODULATION IN A D/A CONVERTER USING A COMBINATION OF FEEDFORWARD/FEEDBACK COEFFICIENTS AND SHIFT REGISTERS

[75] Inventor: Alex Tang, Hsinchu, Taiwan

[73] Assignee: United Microelectronic Corporation, Hsinchu, Taiwan

[21] Appl. No.: 532,128

[22] Filed: Sep. 22, 1995

[51] Int. Cl.[6] .................................................. H03M 3/00
[52] U.S. Cl. ........................ 341/76; 341/143; 341/144
[58] Field of Search ................................ 341/143, 144, 341/61, 76, 77

[56] References Cited

U.S. PATENT DOCUMENTS

| | | | |
|---|---|---|---|
| 4,020,332 | 4/1977 | Crochiere et al. | 341/61 |
| 4,186,384 | 1/1980 | Acker | 341/143 |
| 4,528,551 | 7/1985 | Agrawal et al. | 341/143 |
| 5,196,850 | 3/1993 | Duffy et al. | 341/76 |
| 5,357,248 | 10/1994 | Sasaki | 341/61 |

*Primary Examiner*—Jeffrey A. Gaffin
*Assistant Examiner*—Thuy-Trang N. Huynh
*Attorney, Agent, or Firm*—Townsend and Townsend and Crew LLP

[57] ABSTRACT

A high-order oversampling modulation apparatus is disclosed herein. The present invention implements a high-order oversampling modulation apparatus by use of a plurality of shift registers in response to clock signals provided with a frequency higher than the sampling rate in order to simplify the circuit and layout.

7 Claims, 4 Drawing Sheets

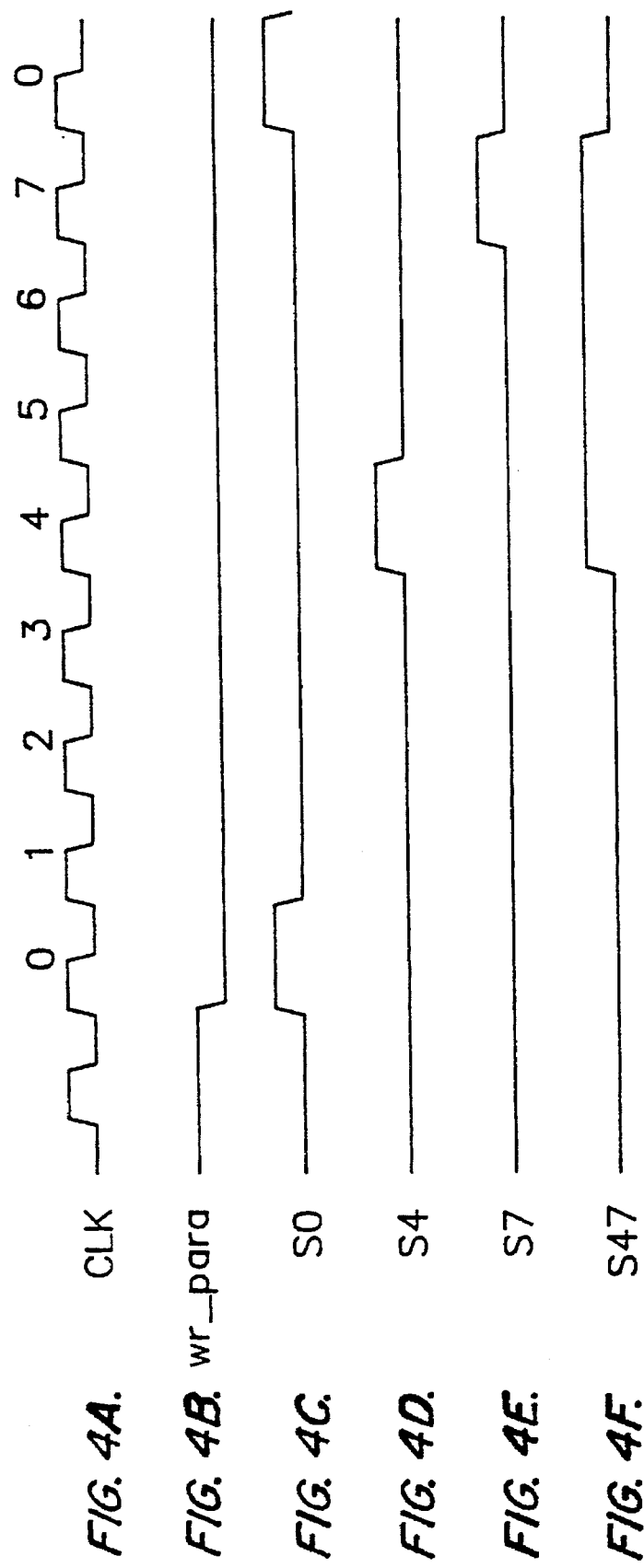
FIG. 4A. CLK
FIG. 4B. wr_para
FIG. 4C. S0
FIG. 4D. S4
FIG. 4E. S7
FIG. 4F. S47

OVERSAMPLING MODULATION IN A D/A CONVERTER USING A COMBINATION OF FEEDFORWARD/FEEDBACK COEFFICIENTS AND SHIFT REGISTERS

BACKGROUND OF THE INVENTION

1. Field of the Invention

The present invention generally relates to an apparatus for digital-to-analog conversion, and more particularly relates to an oversampling modulation apparatus of high-order topology.

2. Description of the Related Art

FIG. 1 illustrates a signal conversion processing of an oversampling modulation apparatus. The oversampling modulation apparatus 1 is applied to a digital-to-analog converter (DAC) for converting a pulse code modulation (PCM) signal 2 into a pulse density modulation (PDM) signal 3. PDM signal 3 is then converted into an analog signal through a filter (not shown). In FIG. 2, a Kth-order loop topology of an oversampling modulation apparatus is proposed by Chao et al.: *A Higher Order Topology for Interpolative Modulators for Oversampling A/D Converters*, published in IEEE Trans. Circuits and Sys., vol. CAS-37, pp. 309–318, Mar. 1990, wherein A1,A2, . . . , AK are feed forward loop coefficients and B1,B2, . . . , BK are feedback loop coefficients. The specific designated feedforward loop and feedback loop coefficients achieve specific modulating characteristics. FIG. 2 is expressed in Z-domain, while each of blocks 4, $(Z^{-1}/1-Z^{-1})$, represents an integration circuit. Each of the state variables, SV1,SV2, . . . , SVK, is relative to the output value of a corresponding block 4. State variables, SV1,SV2, . . . , SVK, multiplied by their corresponding feedforward loop coefficients A1,A2, . . . , AK, through corresponding multipliers 6, are accumulated at an adder 7. Simultaneously, the output value of adder 7 is processed by a 1-bit quantizer 8 to form an output signal Y(Z), and is fed back to an adder 9 to be added with the output value of an adder 7' and the sampled signal X(Z). Specifically, output value of adder 7' comes from the accumulated value of the state variables, SV1,SV2, . . . , SVK, multiplied by the corresponding feedback loop coefficients, B1,B2, . . . , BK, through corresponding multipliers 5.

In the prior art, several efforts were made to achieve a two-order oversampling modulation apparatus (e.g., Candy et al., *"Double Interpolation for Digital-to-Analog Conversion,"* IEEE Trans. Commun., vol. COM-34, pp. 477–481, January 1986). Using conventional techniques it is difficult to provide for higher-order topologies because of the layout complexity which higher-order entails.

SUMMARY OF THE INVENTION

It is therefore an object of the present invention to implement an efficient and relatively simple high-order oversampling modulation apparatus. The invention makes use of a plurality of shift registers accompanying a clock signal (having a frequency higher than the sampling rate) to simplify the system and its layout.

To attain the above object, an oversampling modulator, having an order K, where K is a positive integer greater than or equal to 2, converts pulse code modulation signals into pulse density modulation signals in response to a plurality of clock signals and is divided into a feedforward loop period and a feedback loop period, comprising:

a coefficient registering system for storing K number of feedforward loop coefficients and K number of feedback loop coefficients, for sequentially outputting the feedforward loop coefficients in response to the clock signals during the feedforward loop period, and sequentially outputting the feedback loop coefficients in response to the clock signals during the feedback loop period;

a variable registering system for storing K number of state variables for sequentially outputting the state variables in response to the clock signals during the feedforward loop period, and sequentially outputting the state variables corresponding to the feedback loop coefficients in response to the clock signals during the feedback loop period;

a multiplier connected to the coefficient registering system and the variable registering system for sequentially multiplying the output coefficient by the output state variable for outputting a multiplication value;

an accumulator connected to the multiplier for accumulating the multiplication value into an accumulation value and outputting a sign_bit signal of the sign of the accumulation value;

an overflow circuit connected to the accumulator for receiving the sign_bit signal and latching the sign_bit to form the pulse density modulation signals and for outputting a first reference value and a second reference value, according to the sign_bit, to the accumulator to add to the accumulation value during the first clock signal within the feedback loop period; and a multiple adder connected to the variable registering system and the accumulator for receiving the pulse code modulation signals during the last clock signal within the feedback loop period and for sequentially renovating the state variables during the feedback loop period.

BRIEF DESCRIPTION OF THE DRAWINGS

Other objects, features and advantages of the present invention will become apparent from the following detailed description of the preferred, but nonlimiting embodiment, with reference to the accompanying drawings, in which:

FIG. 4 illustrates the output timing diagram of a phase decoder with respect to FIG. 3.

DETAILED DESCRIPTION OF THE PREFERRED EMBODIMENTS

Figure 1:
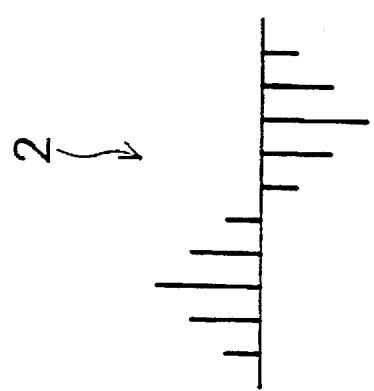
FIG. 1 depicts the signal conversion processing of an oversampling modulation apparatus.
Figure 1:
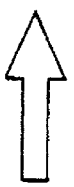
Figure 1:
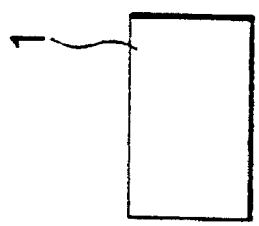
Figure 1:
Figure 1:
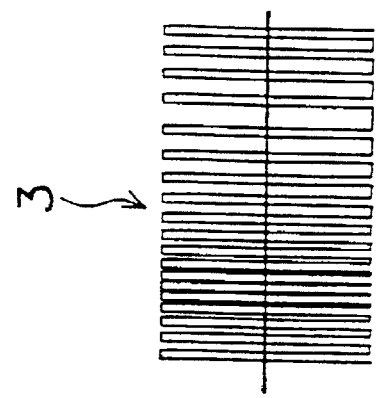
Figure 2:
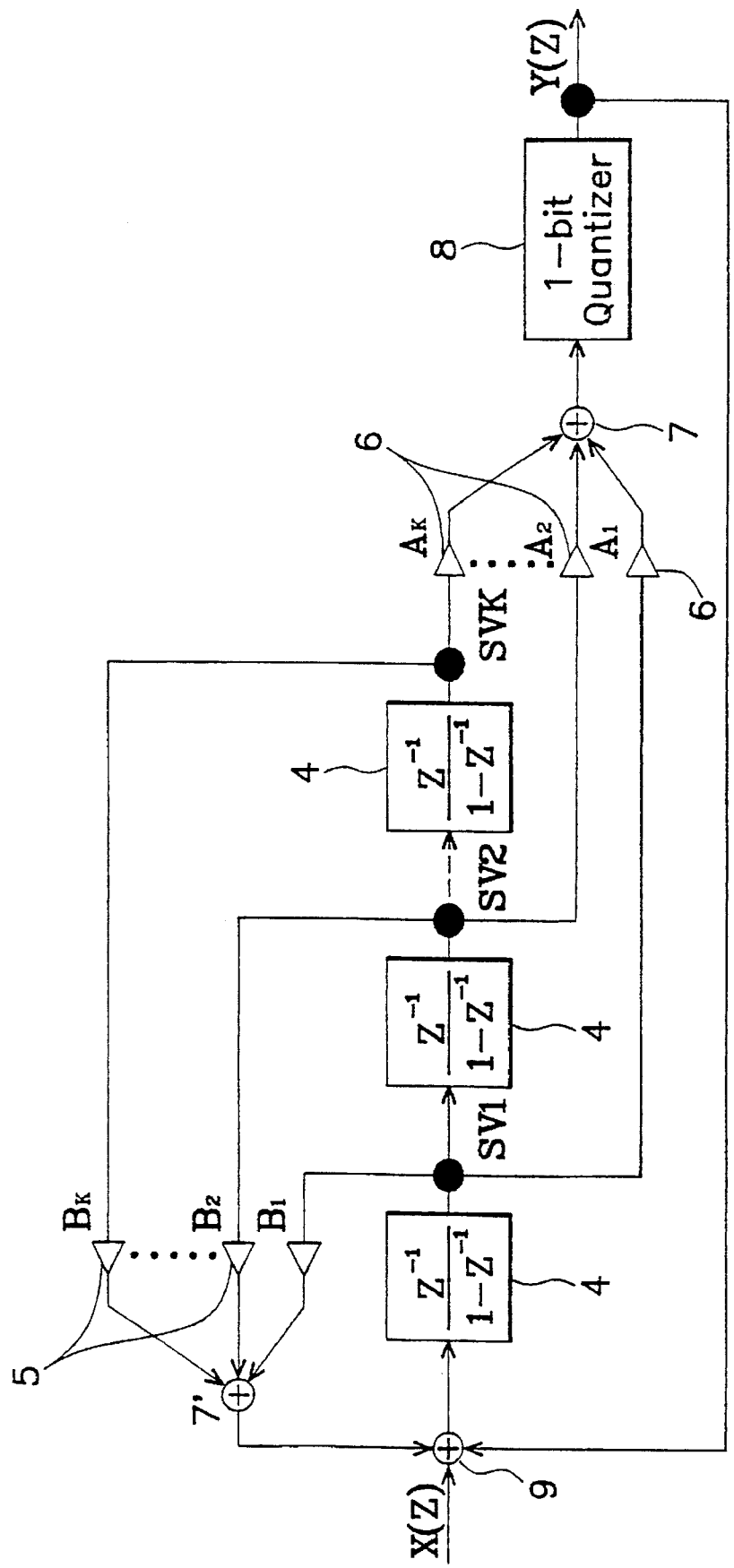
FIG. 2 depicts the Kth-order loop topology of an oversampling modulation apparatus.
Figure 3:
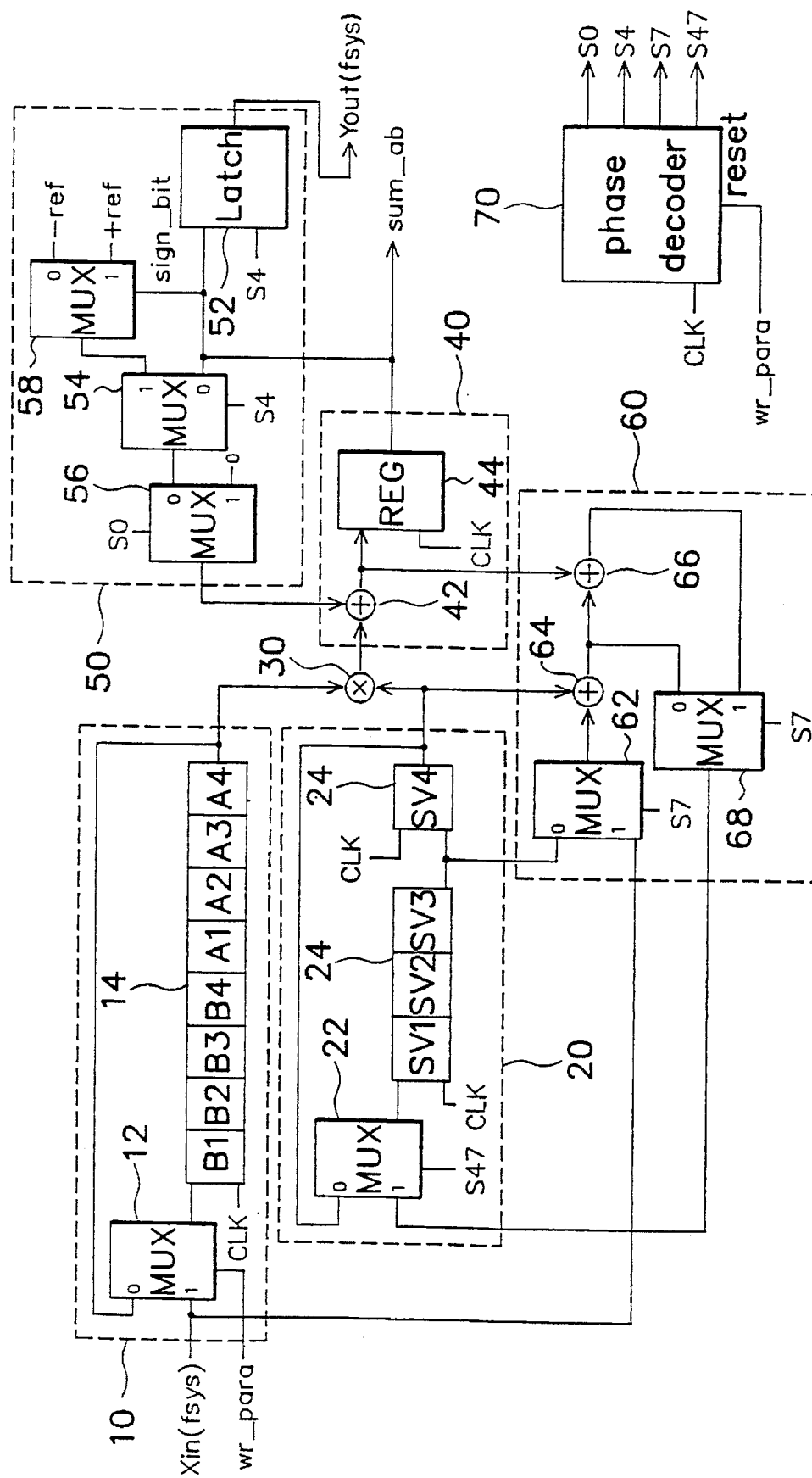
FIG. 3 illustrates the detailed circuit diagram of one preferred embodiment in accordance with the present invention.

One preferred embodiment of the oversampling modulation apparatus, according to the present invention, is shown in FIG. 3, a circuit diagram. This embodiment exemplifies a 4-order (K=4) loop, and accompanies FIG. 4, a timing diagram, to clarify the description.

In FIG. 3, $X_{in}(f_{sys})$ is an input data bus for receiving PCM (pulse code modulation) signals, with the oversampling rate designated as $f_{sys}$. As shown in FIG. 4, the clock signal is designated as CLK, wherein the period from phase 0 to phase 3 constitutes a period of feedforward loop, and the period from phase 4 to phase 7 constitutes a period of feedback loop. Note that the period from phase 0 to phase 7 is relative to a period of sampling; therefore, the frequency of clock signal CLK is at least eight times the oversampling rate $f_{sys}$ (i.e., 8=2*K cycles, where K=4, because of the 4-order loop apparatus exemplified). The oversampling modulation apparatus comprising the coefficient registering means will be described in detail.

A coefficient registering system 10 is used to store four (K=4) feedforward loop coefficients, A1, A2, A3, and A4, and four (K=4) feedback loop coefficients, B1, B2, B3, and B4. During the feedforward loop period, coefficients, A4, A3, A2, and A1, are sequentially sent to a coefficient register output terminal in response to phases 0-3 of the clock signals CLK, respectively. During the feedback loop period, coefficients, B4, B3, B2, and B1, are sequentially sent to the coefficient register output terminal in response to phases 4-7 of the clock signals CLK, respectively.

A variable shift register system 20 stores four (K=4) state variables, SV1, SV2, SV3, and SV4. During the feedforward loop period, state variables are sent to a variable shift register output terminal in the sequence of SV4, SV3, SV2, and SV1 in response to phases 0-3 of the clock signals CLK. During the feedback loop period, state variables are sent to the variable shift register output terminal in the sequence of SV4, SV3, SV2, and SV1 in response to phases 4-7 of the clock signals CLK.

A multiplier 30 is connected to coefficient registering system 10 and variable registering system 20 to receive signals from the output terminals of both registers. Multiplier 30 multiplies the coefficients and the state variable to obtain a multiplication value that is sent to a multiplier output terminal. For example, the multiplication value is A4×SV4 in phase 0, A3×SV3 in phase 1, A2×SV2 in phase 2, A1×SV1 in phase 3, B4×SV4 in phase 4, B3×SV3 in phase 5, B2×SV2 in phase 6, and B1×SV1 in phase 7.

An accumulator 40 is connected to multiplier 30 for sequentially accumulating the multiplication values from multiplier 30 into a single accumulation value. The absolute value of the accumulation value forms one output signal sum_ab, and the sign_bit of the accumulation value is chosen forms another output signal sign_bit. The signal sum_ab measures whether the accumulation value is correct.

An overflow circuit 50 is connected to accumulator 40 for receiving the signal sign_bit of the accumulator 40 and latching the signal sign_bit to form PDM signals at the output terminal $Y_{out}(f_{sys})$ during the period of the first clock of the feedback loop (i.e., in phase 4). At the same time, either a first reference value −ref or a second reference value +ref is selected to feed back to accumulator 40 for summation. If sign_bit is equal to "0", the first reference value −ref is sent to accumulator 40. If sign_bit is equal to "1", the second reference value +ref is sen to accumulator 40.

A multiple adder 60 for receiving PCM signals $X_{in}(f_{sys})$ is connected to variable registering means 20 and accumulator 40. During the feedback loop period, multiple adder 60 sequentially updates the state variables. For example, the updated value SV4 is equal to SV4+SV3 following phase 4, SV3 is equal to SV3+SV2 following phase 5, and SV2 is equal to SV2+SV1 following phase 6. When the accumulation value, SV1, and the sampled $X_{in}(f_{sys})$ are added together, SV1 is updated in phase 7.

Furthermore, a phase decoder 70 generates the timing waveform of S0, S4, S7, and S47 as FIG. 4 illustrates In addition, a read/write controlling signal wr_para is used to reset phase decoder 70.

The detailed circuit operation will be described below. Coefficient registering system 10 comprises a multiplexer 12 and eight (2K) shift registers 14 aligned in a queue. The signal wr_para is used to load these coefficients after the circuit power-on. When wr_para="1", coefficients A4, A3, A2, A1, B4, B3, B2, and B1 are sequentially loaded into shift registers 14 When wr_para is equal to "0", eight shift registers 14 are connected in a loop through multiplexer 12 and move in round-robin fashion from phase 0 to phase 7 every eight clock signals After wr_para is changed from "1" to "0", the first clock signal is designated as phase 0 and out_set the period of phase 0 to phase 7, wherein phase 0 to phase 3 is the period of the feedforward loop, and phase 4 to phase 7 is the period of the feedback loop. In response to clock signals CLK, A4 is sent to the output terminal of coefficient registering System 10 in phase 0, A3 in phase 1, A2 in phase 2, A1 in phase 3, B4 in phase 4, B3 in phase 5, B2 in phase 6, and finally B1 in phase 7. FIG. 3 shows the arrangement for phase 0.

Moreover, variable registering system 20 comprises a multiplexer 22 and four (K) shift registers 24. During the feedforward loop period, shift registers 24 are connected in a loop in response to clock signal CLK through multiplexer 22. In phase 0, SV4 is sent to the output terminal; in phase 1, SV3 is sent to the output; in phase 2, SV2 is sent to the output; in phase 3, SV1 is sent to the output. In brief, state variables are sent to the output terminal of variable registering system 20 in the sequence SV4, SV3, SV2, and SV1. FIG. 3 shows the arrangement for phase 0. During the feedback loop period in response to the signal S47, the state variables still are sent in the sequence of SV4, SV3, SV2 and SV1, but the difference is that the newly stored value has been updated through multiple adder 60. The updated values are SV4=SV4+SV3, SV3=SV3+SV2, SV2=SV2+SV1, and SV1 is equal to the summation of SV1, $X_{in}(f_{sys})$ and the accumulation value in phase 7 of the accumulator 40. The updating operation is described below in the paragraph about multiple adder 60 below.

Accumulator 40 comprises an adder 42 and a register 44. Adder 42 sums the values of multiplier 30 to form the multiplication value, and then stores that value in register 44 which is provided with an output terminal sum_ab for measurement. In particular, the signal sign_bit transmits the accumulation value sign to overflow circuit 50. If the accumulation value is positive, sign_bit=0. Alternatively, if the accumulation value is negative, sign_bit is equal to "1".

Overflow circuit 50 is provided with multiplexers 54, 56, 58 and a latch 52. In phase 4 in response to signal S4, latch 52 receives and latches signal sign_bit to send PDM signals to the output terminal $Y_{out}(f_{sys})$. Multiplexer 56 clears accumulator 40 to zero according to signal S0. Multiplexer 58 selects either the first reference value −ref or the second reference value +ref as the input signal of multiplexer 54. When sign_bit is "0", −ref is selected; +ref is selected when sign_bit is "1". According to signal S4, in phase 4, the reference value is sent to adder 42 of accumulator 40 for summation sequentially through the multiplexers 58, 54, and 56.

Finally, multiple adder 60 comprises multiplexers 62, 68 and adders 64, 66. In particular, multiple adder 60 concentrates on the feedback loop period. In phase 4, multiplexer 62 and adder 64 add SV3 with SV4, and the value SV4+SV3 is stored as updated SV4 in variable registering system 20 through multiplexer 68. Following the same process, updated values SV3 and SV2 are equal to SV3+SV2 and SV2+SV1, respectively, in phases 5 and 6. Ultimately, with respect to signal S7, the input signal $X_{in}(f_{sys})$ is sampled to add with SV1 through adder 64 and with the accumulation value of accumulator 42 through adder 66 to form the updated SV1, which is then stored in variable registering system 20 through the multiplexer 68.

In conclusion, the preferred embodiment of the present invention implements a high-order oversampling modulation apparatus using a plurality of shift registers in response to clock signal with frequency higher than the sampling rate therefore to simplify the circuit and layout. Although the order of the above embodiment focuses on 4, higher-order (K>4) oversampling modulation apparatus can be implemented through the present invention.

While only certain preferred features of the invention have been shown by way of illustration, many modifications and changes will occur to those skilled in the art. It is to be understood that the appended claims are intended to cover all such modifications and changes as fall within the true spirit and the scope of the invention.

What is claimed is:

1. An oversampling modulator, having an order K, where K is a positive integer greater than or equal to 2, for converting, responsive to a plurality of clock signals having a feedforward loop period and a feedback loop period, a plurality of pulse code modulation signals into a plurality of pulse density modulation signals, comprising:

coefficient registering means for storing K number of feedforward loop coefficients and K number of feedback loop coefficients, said coefficient registering means sequentially outputting said feedforward loop coefficients in response to said clock signals during said feedforward loop period, and sequentially outputting said feedback loop coefficients in response to said clock signals during said feedback loop period;

variable registering means for storing K number of state variables, said variable registering means sequentially outputting said state variables in response to said clock signals during said feedforward loop period, and sequentially outputting said state variables, corresponding to said feedback loop coefficients in response to said clock signals during said feedback loop period;

a multiplier connected to said coefficient registering means and said variable registering means for sequentially multiplying the outputting coefficient by the outputting state variable for outputting a multiplication value;

an accumulator connected to said multiplier for accumulating said multiplication value into an accumulation value, and outputting the sign_bit signal of said accumulation value;

overflow means connected to said accumulator for receiving said sign_bit signal, and latching said sign_bit to form said pulse density modulation signals and outputting one of a first reference value and a second reference value, according to said sign_bit, into said accumulator to add with said accumulation value during the first clock signal within said feedback loop period; and a multiple adder connected to said variable registering means and said accumulator for receiving said pulse code modulation signals during the last clock signal within said feedback loop period, and sequentially renovating said state variables during said feedback loop period.

2. The oversampling modulator as in claim 1, further comprising a phase decoder for forming said plurality of clock signals, dividing said plurality of clock signals into said feedforward loop period and said feedback loop period, defining said first clock signal of said feedback loop period, and defining said last clock signal of said feedback loop period.

3. The oversampling modulator, as in claim 1, wherein said coefficient registering means comprises K+K number of shift registers for storing said feedforward loop coefficients and said feedback loop coefficients in a loop configuration.

4. The oversampling modulator as in claim 1, wherein said variable registering means comprises K number of shift registers for storing said state variables, said shift registers connected in a loop during said feedforward loop period and wherein said variable registering means sequentially updates said state variables through said multiple adder during said feedback loop period.

5. The oversampling modulator as in claim 1, wherein said accumulator comprises an adder and a register; said adder connected to said multiplier to receive said multiplication value and to sequentially add said multiplication value to said multiple adder and said register; said register choosing said sign_bit signal from said accumulation value to output to said overflow means.

6. The oversampling modulator as in claim 1, wherein said overflow means comprises a multiplexer to clear said accumulator prior to proceeding into said feedforward loop period.

7. An oversampling modulator, having an order K, where K is a positive integer greater than or equal to two, for converting, responsive to a plurality of clock signals having a feedforward loop period and a feedback loop period, a plurality of pulse code modulation signals (Xin(fsys)) into a plurality of pulse density modulation signals (Yout(fsys)), comprising:

a coefficient registering system for storing K number of feedforward loop coefficients and K number of feedback loop coefficients, said coefficient registering system, responsive to the plurality of clock signals, sequentially outputting, at a first output, said feedforward loop coefficients, during the feedforward loop period, and sequentially outputting, at said first output, said feedback loop coefficients during the feedback loop period;

a variable registering system for storing K number of state variables, said variable registering system, responsive to the plurality of clock signals, sequentially outputting, at a second output said state variables during the feedforward loop period, and sequentially outputting, at said second output, said state variables corresponding to said feedback loop coefficients during the feedback loop period;

a multiplier, coupled to said first output and to said second output, for sequentially multiplying each of said sequentially outputted coefficients by a corresponding one of said sequentially output state variables for generating a plurality of multiplication values;

an accumulator, coupled to said multiplier, for accumulating said plurality of multiplication values into an accumulation value, wherein said accumulation value has a sign_bit, wherein said accumulator outputs, at a fourth output, a sign_bit signal having a value corresponding to said sign_bit of said accumulation value;

an overflow circuit, coupled to said fourth output, for receiving said sign_bit signal, said overflow circuit latching said sign_bit to provide the plurality of pulse density modulation signals, and said overflow circuit for outputting one of a first reference value and a second reference value, according to said sign_bit, into said accumulator to accumulate with said accumulation value during a first clock signal of the feedback loop period; and a multiple adder, coupled to said variable registering system and to said accumulator, for receiving the plurality of pulse code modulation signals during a last clock signal of the feedback loop period, and sequentially renovating said state variables during the feedback loop period.

* * * * *